United States Patent
Isoda (10) Patent No.: US 9,746,865 B2
(45) Date of Patent: Aug. 29, 2017

(54) CURRENT-TO-VOLTAGE CONVERSION CIRCUIT, RECEPTION APPARATUS, AND IMAGING SYSTEM

(71) Applicant: CANON KABUSHIKI KAISHA, Tokyo (JP)

(72) Inventor: Naoki Isoda, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/091,164

(22) Filed: Apr. 5, 2016

(65) Prior Publication Data

US 2016/0308496 A1 Oct. 20, 2016

(30) Foreign Application Priority Data

Apr. 17, 2015 (JP) .................. 2015-084930

(51) Int. Cl.
| | |
|---|---|
| *H03F 1/14* | (2006.01) |
| *G05F 1/56* | (2006.01) |
| *H03F 3/08* | (2006.01) |
| *H03F 3/45* | (2006.01) |

(52) U.S. Cl.
CPC .............. *G05F 1/561* (2013.01); *H03F 1/14* (2013.01); *H03F 3/087* (2013.01); *H03F 3/45475* (2013.01)

(58) Field of Classification Search
CPC ... G05F 1/00; G05F 1/561; H03F 1/14; H03F 1/3211; H03F 3/00; H03F 3/087; H03F 3/45179; H03F 3/45197; H03F 3/45475
USPC ........................................................ 327/103
See application file for complete search history.

(56) References Cited

U.S. PATENT DOCUMENTS

| | | | |
|---|---|---|---|
| 5,481,218 A | * | 1/1996 | Nordholt ................ H03G 7/001 327/350 |
| 6,788,152 B2 | * | 9/2004 | Nishizono ............ H03G 3/3084 250/214 A |
| 7,358,995 B2 | | 4/2008 | Koseki |
| 7,755,411 B2 | | 7/2010 | Isoda |

(Continued)

FOREIGN PATENT DOCUMENTS

| | | |
|---|---|---|
| JP | 2003-318681 | 11/2003 |
| JP | 2003-348464 | 12/2003 |
| JP | 2010-249786 | 11/2010 |

*Primary Examiner* — Lincoln Donovan
*Assistant Examiner* — David Mattison
(74) *Attorney, Agent, or Firm* — Fitzpatrick, Cella, Harper & Scinto (57) ABSTRACT

Provided is a current-to-voltage conversion circuit, including: an input/output node configured to input a current signal including a direct current component and an alternating current component, and to output a voltage based on the current signal; an amplification unit configured to input the voltage of the input/output node; an extraction unit configured to output a voltage based on a direct current component of a voltage output from the amplification unit; a first current supply unit configured to supply a current based on the voltage output from the extraction unit to the input/output node; and a second current supply unit configured to supply a current based on the alternating current component of the current signal to the input/output node. The current supplied by the second current supply unit corresponds to a difference between a current of the current signal and the current supplied by the first current supply unit.

8 Claims, 6 Drawing Sheets

(56) References Cited

U.S. PATENT DOCUMENTS

| | | |
|---|---|---|
| 8,174,317 B2 | 5/2012 | Isoda |
| 2009/0212840 A1* | 8/2009 | Isoda ...................... H03F 3/087 |
| | | 327/307 |
| 2015/0188537 A1 | 7/2015 | Isoda |

* cited by examiner

CURRENT-TO-VOLTAGE CONVERSION CIRCUIT, RECEPTION APPARATUS, AND IMAGING SYSTEM

BACKGROUND OF THE INVENTION

Field of the Invention

The present invention relates to a current-to-voltage conversion circuit, a reception apparatus, and an imaging system.

Description of the Related Art

In a current-output type sensor configured to output a current, an alternating current (AC) component of an output signal may be an effective signal, and a direct current (DC) component thereof may be disturbance. This DC component may be an unnecessary component that narrows an operation range of a circuit when the output signal of the current-output type sensor is processed. Therefore, a method of removing the DC component and passing the AC component is necessary.

As the method of removing the DC component, a method using a coupling capacitor is known. This method can block the transmission of the DC component, and can pass the AC component by converting the current output from the sensor to a voltage, and then transmitting the voltage to a subsequent stage via the coupling capacitor. This method can accurately remove the DC component when the DC current contained in the output from the sensor is sufficiently smaller than the AC current.

However, when the DC current is relatively larger than the AC current, in order to prevent a circuit operation saturation when converting the current to the voltage, a nonlinear voltage conversion such as a logarithmic compression may be carried out. In this case, the signal-to-noise ratio (SNR) may degrade. In other words, when an extent of the change in the current (dynamic range) of the DC component or the AC component of the output signal is large due to an external factor such as an operation environment of the sensor and a variation in the output of the sensor, this method has a limit.

As a solution for this problem, in Japanese Patent Application Laid-Open No. 2010-249786, the DC component and the AC component are separated while the sensor signal is still the current signal, and only the AC current is finally processed as an effective signal by an operational amplifier. This method uses a feedback circuit so as to extract only the DC component of the sensor signal, and subtract a replica current having the same magnitude as the DC component from the sensor signal current, thereby acquiring the AC current. An extraction accuracy of the DC component increases as the DC current increases with respect to the AC current, and hence this method can prevent the SNR from degrading.

In the technology according to Japanese Patent Application Laid-Open No. 2010-249786, a circuit for a signal processing unit configured to detect the DC component of the sensor output so as to generate the replica current, and a circuit for a unit configured to calculate the AC component partially overlap each other. The DC component and the AC component are separated depending on a frequency characteristic of an impedance existing in a sensor output node, and this frequency characteristic is determined by a circuit constant. The existence of the overlapping portion between the circuits generates a restriction on a setting range of the frequency characteristic for separating the DC component and the AC component from each other. As a result, the signal separation performance for the DC component and the AC component may be insufficient, and simultaneous satisfaction of the removal of the DC component in a wider dynamic range and the detection of the AC component in a wide dynamic range is limited.

SUMMARY OF THE INVENTION

According to one embodiment of the present invention, there is provided a current-to-voltage conversion circuit, including: an input/output node configured to input a current signal including a direct current component and an alternating current component, and to output a voltage based on the current signal; an amplification unit configured to input the voltage of the input/output node; an extraction unit configured to output a voltage based on a direct current component of a voltage output from the amplification unit; a first current supply unit configured to supply a current based on the voltage output from the extraction unit to the input/output node; and a second current supply unit configured to supply a current based on the alternating current component of the current signal to the input/output node, in which the current supplied by the second current supply unit corresponds to a difference between a current of the current signal and the current supplied by the first current supply unit.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

(First Embodiment)

Referring to FIG. 1 to FIG. 4, a description is now given of a configuration of a current-to-voltage conversion circuit 100 according to a first embodiment of the present invention.

Figure 1:
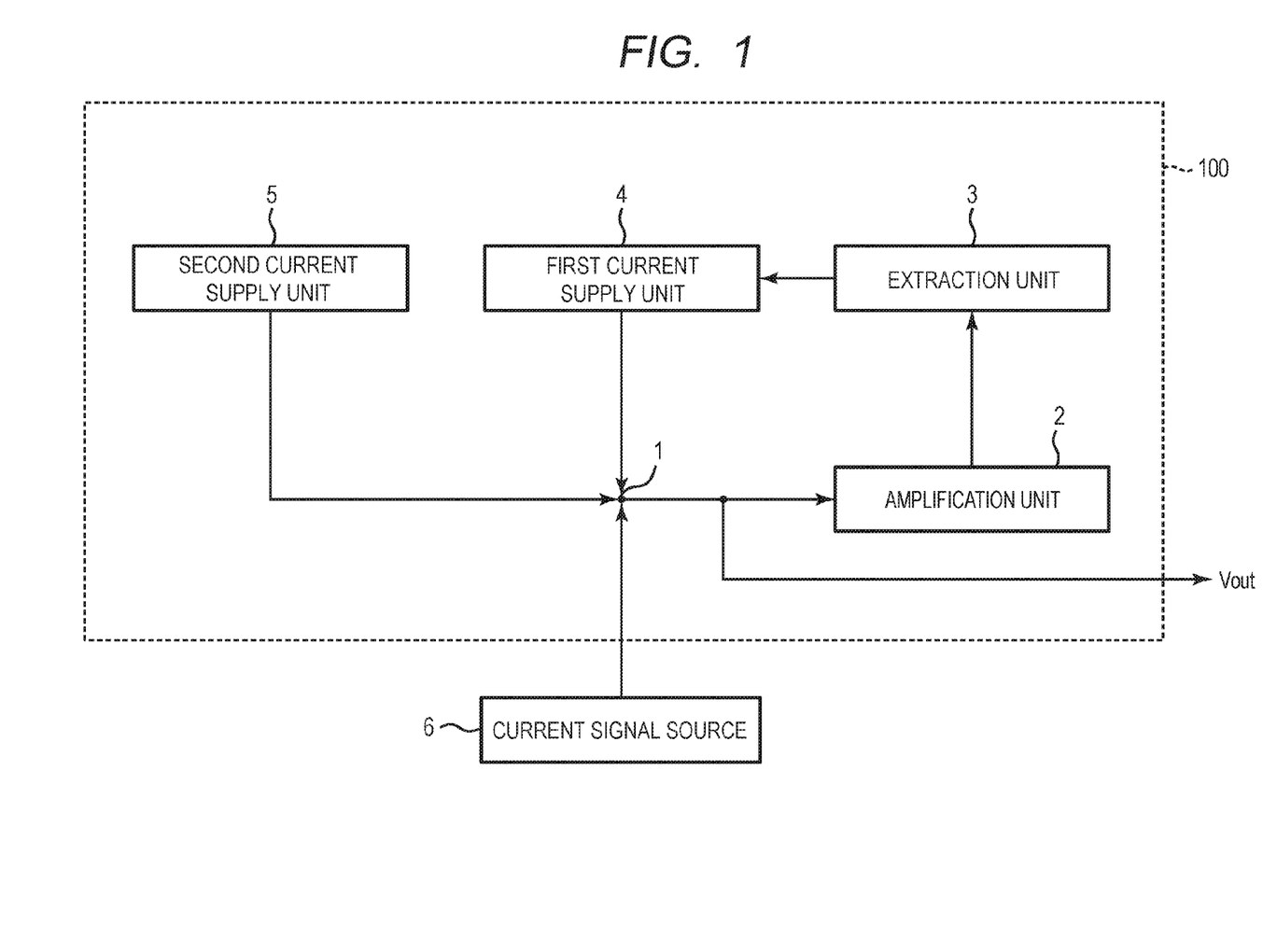
FIG. 1 is a block diagram for illustrating a current-to-voltage conversion circuit according to a first embodiment of the present invention.

First, referring to FIG. 1, a description is given of a schematic configuration of this embodiment. FIG. 1 is a block diagram of the current-to-voltage conversion circuit 100 according to the first embodiment of the present invention. The current-to-voltage conversion circuit 100 according to this embodiment can be used for an apparatus configured to detect, for example, an optical pulse signal under disturbance light mainly including a DC component. The current-to-voltage conversion circuit 100 includes an input/output node 1, an amplification unit 2, an extraction unit 3, a first current supply unit 4, and a second current supply unit 5. A current signal source 6 is, for example, an optical sensor of a current sink type or a current source type. The current signal source 6 is connected to the input/output node 1. The current-to-voltage conversion circuit 100 processes a current signal including an AC component and a DC component input to the input/output node 1. In the following description, the current signal source 6 is an optical sensor of a current sink type. In other words, the same current as a current flowing through the current signal source 6 flows out from the input/output node 1.

The current-to-voltage conversion circuit 100 includes a DC feedback loop including the amplification unit 2, the extraction unit 3, and the first current supply unit 4. The voltage of the input/output node 1 is input to the amplification unit 2. The amplification unit 2 outputs a signal obtained by amplifying the voltage of the input/output node 1 to the extraction unit 3. The extraction unit 3 outputs a voltage based on a direct current component of the signal output from the amplification unit 2 to the first current supply unit 4. The first current supply unit 4 supplies a current based on the voltage input from the extraction unit 3 to the input/output node 1. The second current supply unit 5 supplies a current based on the alternating current component of the current signal to the input/output node 1.

With the above-mentioned configuration, the currents including the DC component and the AC component flowing out from the input/output node 1 by the current signal source 6 are supplied from the first current supply unit 4 and the second current supply unit 5. The DC component is supplied mainly from the first current supply unit 4. The AC component is supplied mainly from the second current supply unit 5. A voltage Vout of the input/output node 1 defined by a voltage drop caused by those currents serve as an output voltage of the current-to-voltage conversion circuit 100.

Figure 2:
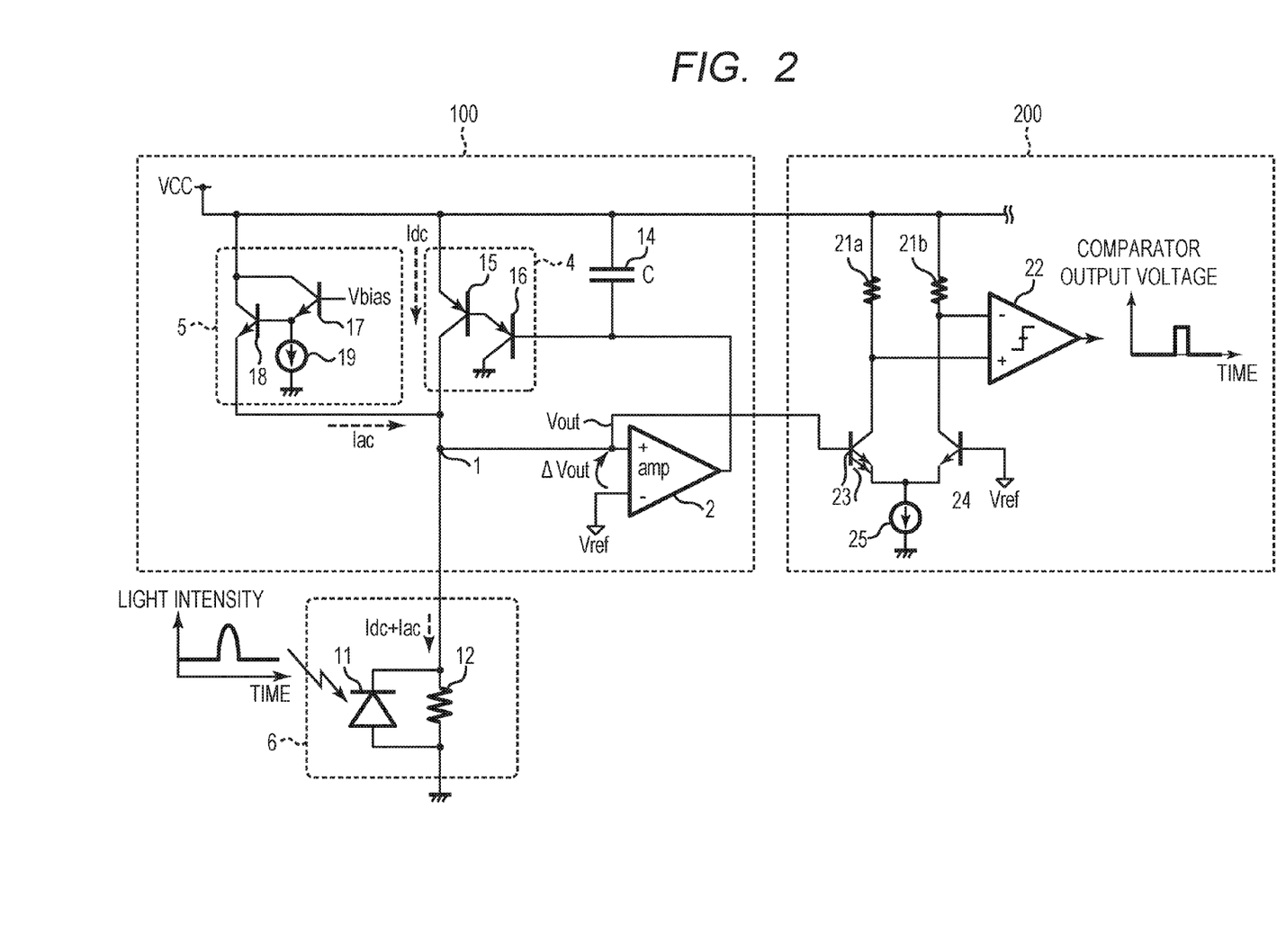
FIG. 2 is a circuit diagram for illustrating the current-to-voltage conversion circuit according to the first embodiment of the present invention.

FIG. 2 is a circuit diagram for illustrating in more detail the configuration of the block diagram illustrated in FIG. 1. Moreover, in FIG. 2, an output circuit 200 configured to shape a voltage variation amount of the output voltage Vout into a pulse to output the pulse is added. A description is now given of the circuit configuration of FIG. 2 while correspondences to the block diagram of FIG. 1 are referred to.

The current signal source 6 illustrated in FIG. 1 corresponds to, in FIG. 2, a photodiode 11 having an anode that is grounded and a cathode that is connected to the input/output node 1 of the current-to-voltage conversion circuit 100, and a resistance element 12 connected in parallel with the photodiode 11. When light enters the photodiode 11, a current corresponding to a light amount flows from the cathode of the photodiode 11 to the ground. Moreover, an electric potential drop current corresponding to an electric potential of the input/output node 1 flows via the resistance element 12 to the ground. The incident light includes a temporarily-constant disturbance component and a signal component entering the photodiode 11 as a pulse form. Therefore, the current generated in a parallel connection of the resistance element 12 and the photodiode includes a DC component and an AC component. In the following, this current is denoted by Idc+Iac. Note that, hereinafter a state in which Iac is zero or minute is hereinafter referred to as a steady state.

The amplification unit 2 is an operational transconductance amplifier (OTA) including a non-inverting input terminal, an inverting input terminal, and an output terminal. The non-inverting input terminal of the amplification unit 2 is connected to the input/output node 1. To the inverting input terminal of the amplification unit 2, a reference voltage Vref is input. The amplification unit 2 is constructed by the OTA, and thus has a high output impedance. The value of this output impedance is denoted by Ro1. Moreover, a voltage between the input terminals is denoted by ΔVout (=Vout−Vref).

The extraction unit 3 illustrated in FIG. 1 corresponds to, in FIG. 2, a low-pass filter formed by the output impedance Ro1 of the amplification unit 2 and a capacitance element 14 having one terminal to which a power supply voltage VCC is input. When the capacitance of the capacitance element 14 is C, a cutoff angular frequency of the low-pass filter is $1/(Ro1 \cdot C)$. This cutoff angular frequency is set so as to attenuate the AC component of the input signal. The voltage of the signal that has passed through the low-pass filter is input to the first current supply unit 4.

The first current supply unit 4 illustrated in FIG. 1 corresponds to, in FIG. 2, a Darlington PNP transistor including PNP transistors 15 and 16. The voltage output from the amplification unit 2 via the extraction unit 3 is input to the base of the PNP transistor 16, which is a first stage transistor. The collector of the PNP transistor 16 is grounded, and the emitter thereof is connected to the base of the PNP transistor 15. In other words, the PNP transistor 16 constructs an emitter follower, and, to the base of the PNP transistor 15, a voltage based on the input voltage to the first current supply unit 4 is thus input. As a result, at the collector of the PNP transistor 15 connected to the input/output node 1, a collector current is generated. This current is denoted by Idc. Moreover, to the emitter of the PNP transistor 15, the power supply voltage VCC is input. Note that, the input impedance of the Darlington PNP transistor is sufficiently larger than Ro1, and does not thus affect the cutoff frequency of the low-pass filter.

As described above, the amplification unit 2, the extraction unit 3, and the first current supply unit 4 form the DC feedback loop.

The second current supply unit 5 illustrated in FIG. 1 corresponds to, in FIG. 2, a Darlington NPN transistor including NPN transistors 17 and 18 and a current source 19. To the base of the NPN transistor 17, a bias voltage Vbias is input. The emitter of the NPN transistor 17 is connected to the current source 19 configured to bias a predetermined current, and the base of the NPN transistor 18. To the collectors of the NPN transistors 17 and 18, the power supply voltage VCC is input. The emitter of the NPN transistor 18 is connected to the input/output node 1. The emitter current of the NPN transistor 18 is denoted by Iac. The current flowing into the input/output node 1 and the current flowing out from the input/output node 1 are equal to each other, and the current Iac, which is the emitter current of the NPN transistor 18, thus corresponds to a difference between the current (Idc+Iac) flowing through the current signal source 6 and the collector current Idc of the PNP transistor 15.

The output circuit 200 is an example of a circuit configured to shape the waveform of the voltage Vout, which is an analog signal, into a digital signal pulse to output the digital signal pulse. The output circuit 200 includes resistance elements 21a and 21b, a comparator 22, a multi-emitter NPN transistor 23, an NPN transistor 24, and a current source 25, and constructs a comparison circuit by means of a differential pair.

The input/output node 1 is connected to the base of the multi-emitter NPN transistor 23. The emitters of the multi-emitter NPN transistor 23 are connected to the current source 25. The collector of the multi-emitter NPN transistor 23 is connected to one terminal of the resistance element 21a and a non-inverting input terminal of the comparator 22. To another terminal of the resistance element 21a, the power supply voltage VCC is input.

To the base of the NPN transistor 24, the reference voltage Vref is input. The emitter of the NPN transistor 24 is connected to the current source 25. The collector of the NPN transistor 24 is connected to one terminal of the resistance element 21b and an inverting input terminal of the comparator 22. To another terminal of the resistance element 21b, the power supply voltage VCC is input. In other words, the respective transistors in the output circuit 200 form the differential pair.

The resistances of both the resistance elements 21a and 21b are the same. On this occasion, the output circuit 200 serves as a circuit configured to output a voltage at a high level or a low level based on the voltage Vout input to the base of the multi-emitter NPN transistor 23, and based on the reference voltage Vref input to the base of the NPN transistor 24.

Note that, the multi-emitter NPN transistor 23 on a side to which the voltage Vout is input has the multi-emitter configuration, and a larger amount of current flows through the multi-emitter NPN transistor 23 than through the NPN transistor 24. Thus, the voltage drop across the resistance element 21a is more than the voltage drop across the resistance element 21b. Thus, in the comparison in the comparator 22, a threshold voltage Vth is lower than the reference voltage Vref. In this way, by differentiating the threshold voltage Vth and the reference voltage Vref from each other, a malfunction resulting from a minute voltage change caused by a noise can be suppressed. Note that, when the threshold voltage Vth is set to be too low, there can pose such a problem that the alternating current component cannot be detected when the alternating current component is input, and the threshold voltage Vth is thus preferred to be set to a value between the reference voltage Vref and a voltage when the alternating current component is detected.

In other words, the comparator 22 outputs the high level when the voltage Vout is smaller than the threshold voltage Vth, and outputs the low level otherwise. In this way, the change in the voltage Vout of the input/output node 1 is shaped into the digital signal pulse, and is output to a microcontroller on a subsequent stage.

A description is now given of an operation of the current-to-voltage conversion circuit 100. First, a description is given of an operation in the steady state in which the signal is not input to the photodiode 11, and the AC component is hardly included in the current Idc+Iac flowing through the current signal source 6.

In the steady state, due to the effect of the virtual short circuit between the inverting input terminal and the non-inverting input terminal of the amplification unit 2, the voltage of the input/output node 1 (namely, the output voltage Vout of the current-to-voltage conversion circuit 100) is almost equal to the reference voltage Vref. Thus, the emitter voltage of the NPN transistor 18 is also almost equal to the reference voltage Vref in the steady state.

On the other hand, the base terminal of the NPN transistor 18 is set to a bias voltage smaller than Vref+0.6 V so that the emitter current is approximately zero in the steady state. In other words, the bias voltage Vbias input to the base of the NPN transistor 17 is lower than Vref+1.2 V. As a result, in the steady state in which the voltage of the input/output node 1 is a voltage based on the direct current component of the current signal, the current Iac supplied by the NPN transistor 18 is almost zero. Note that, the above-mentioned bias voltage is a value determined while assuming that a cutoff voltage of the bipolar transistor is approximately 0.6 V, and may be set to a value different from this value when the configuration of the transistor is different.

In the steady state, the DC feedback by the amplification unit 2, the extraction unit 3, and the first current supply unit 4 supplies the current from the first current supply unit 4 so that the sum of the inflow current and the outflow current at the input/output node 1 is zero. In other words, a replica DC current having the same magnitude as and an opposite sign to the DC component of the current flowing through the current signal source 6 is supplied from the first current supply unit 4. At the input/output node 1, these currents cancel each other. As a result of the above operation, this DC feedback stably operates.

Figure 3A:
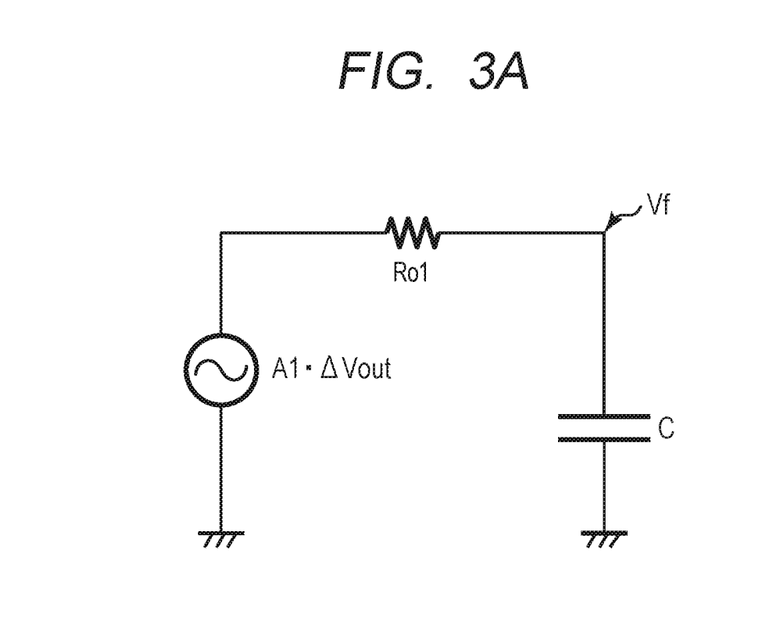
FIGS. 3A and 3B are equivalent circuit diagrams for illustrating a feedback loop in a steady state.
Figure 3B:
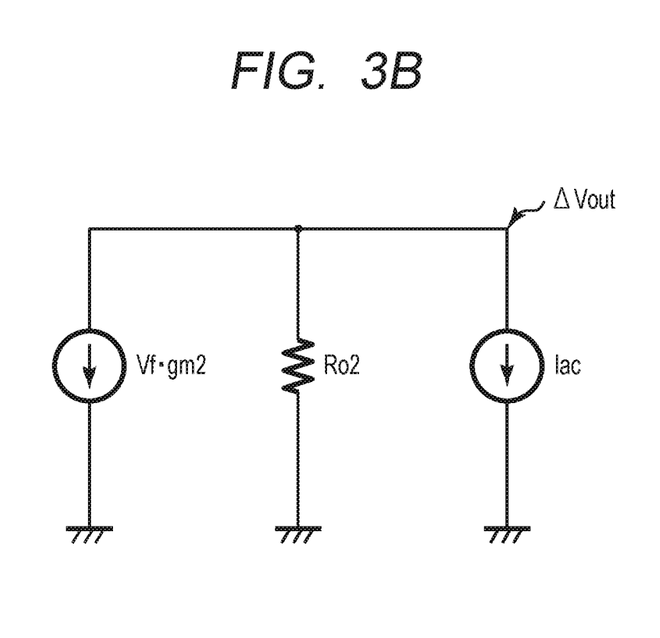

FIGS. 3A and 3B are diagrams for illustrating AC equivalent circuits of the feedback loop in the steady state. FIG. 3A is a diagram for illustrating an equivalent circuit in a section from the output of the amplification unit 2 to the input of the current supply unit 4. FIG. 3B is a diagram for illustrating an equivalent circuit in a section from the output of the first current supply unit 4 to the input of the amplification unit 2. On this occasion, s is the operator of the Laplace transform, Ro2 is an output impedance of the PNP transistor 15, A1 is a voltage gain of the amplification unit 2, gm2 is a transconductance of the first current supply unit 4, and Vf is a voltage of the input node of the first current supply unit 4.

Expression 1 is acquired by solving circuit equations of the equivalent circuits illustrated in FIGS. 3A and 3B in terms of ΔVout and Iac.

$$\frac{\Delta Vout}{Iac} = -\frac{s \cdot C \cdot Ro1 + 1}{s \cdot C \cdot Ro1 + 1 + gm2 \cdot Ro2 \cdot A1} Ro2 \approx \quad \text{(Expression 1)}$$
$$-\frac{s \cdot C \cdot Ro1 + 1}{s \cdot C \cdot Ro1 + 1 + gm2 \cdot Ro2 \cdot A1} Ro2$$

Figure 4:
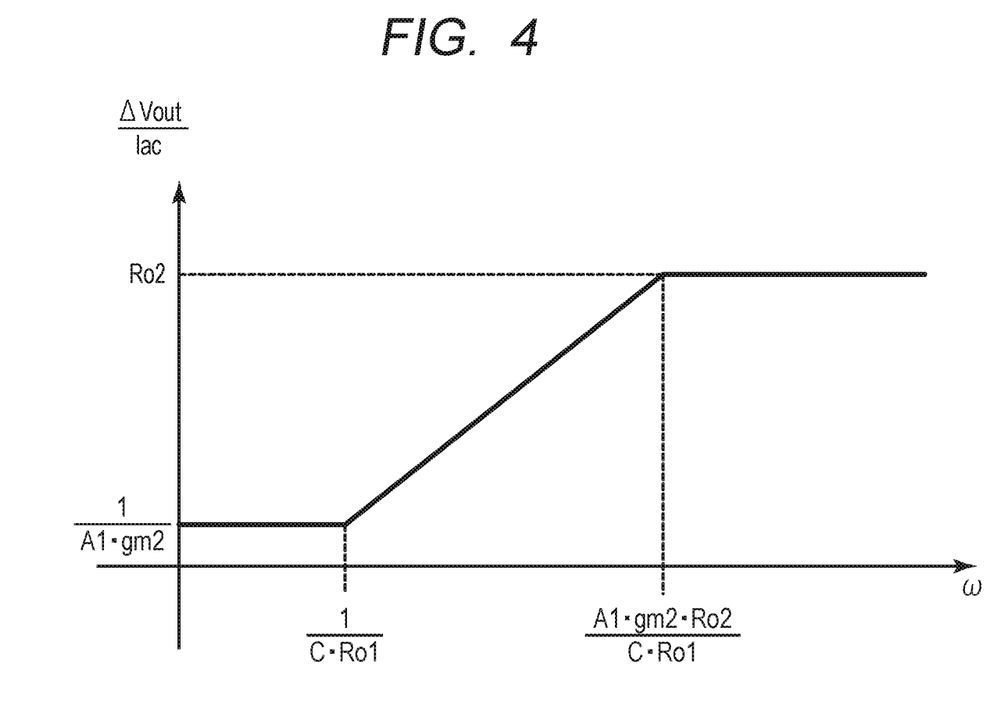
FIG. 4 is a graph for illustrating a frequency characteristic of a gain of the feedback loop.

FIG. 4 is a graph illustrating a dependency of a gain of the DC feedback loop on an angular frequency ω based on Expression 1.

In FIG. 4, when a gain ratio between a low-frequency region and a high-frequency region in the steady state is considered as an index of a DC/AC separation performance, the DC/AC separation performance in this embodiment is Ro2/(1/(A1·gm2))=gm2·Ro2·A1.

On the other hand, the DC/AC separation performance illustrated in FIG. 4 of Japanese Patent Application Laid-Open No. 2010-249786 is R1/(R1/(1+gm·R1))≈gm·R1.

R1 of Japanese Patent Application Laid-Open No. 2010-249786 corresponds to an IC on-chip resistor, and is estimated to be several tens of kΩ. This value is equal to or less than Ro2 of this embodiment. Moreover, transistors of Japanese Patent Application Laid-Open No. 2010-249786 are constructed by bipolar transistors, and it is estimated that gm2 according to this embodiment and gm according to Japanese Patent Application Laid-Open No. 2010-249786 are not greatly different from each other. Thus, the DC/AC separation performance of this embodiment is considered to be at least A1 times as high as Japanese Patent Application Laid-Open No. 2010-249786 where A1 is the voltage gain of the amplification unit 2.

Thus, according to this embodiment, the DC/AC separation performance increases. Therefore, even when the DC component included in the current signal is large, and the AC component is relatively smaller than the DC component, the circuit operation does not saturate, and ΔVout sufficiently large for the detection can be extracted. Note that, the value of ΔVout at this time is ΔVout=−Ro2·Iac.

A description is now given of an operation in a case in which a pulse of the optical signal is input to the photodiode 11, and the AC component is generated in the output current of the current signal source 6. When the current Iac of the AC component increases, ΔVout decreases compared with that in the steady state (increases toward the negative direction). On this occasion, a voltage ($V_B$-$V_E$) between the base and the emitter of the NPN transistor increases, and an emitter resistance of the NPN transistor 18 decreases. When the emitter resistance is Re, a relationship in Expression 2 is acquired.

$$V_B - V_E \approx \frac{kT}{q}\ln\frac{I_E}{I_S} \Rightarrow \text{Re} = -\frac{\partial V_E}{\partial I_E} = \frac{V_T}{I_S}\exp\frac{V_E - V_B}{V_T} \quad \text{(Expression 2)}$$

On this occasion, k is the Boltzmann constant, T is the absolute temperature, q is the elementary charge, IS is a saturation current of the bipolar transistor, and $V_T$=k·T/q.

In other words, the emitter resistance Re exponentially changes as the base voltage $V_B$ changes. When the emitter voltage $V_E$ of the NPN transistor 18 decreases as Vout decreases, the emitter resistance Re exponentially decreases.

On the other hand, ΔVout can be approximated as Expression 3.

$$\Delta Vout = -\frac{Ro2 \cdot \text{Re}}{Ro2 + \text{Re}} Iac \xrightarrow{Ro2 \ll Re} -Ro2 \cdot Iac \xrightarrow{Ro2 \gg Re} -\text{Re} \cdot Iac \quad \text{(Expression 3)}$$

In the steady state of the current-to-voltage conversion circuit 100 (in other words, when Iac is small), the emitter resistance Re of the NPN transistor 18 is very large. Thus, as described on a second line of Expression 3, Ro2·Re/(Ro2+Re) is approximated to Ro2, and the first current supply unit 4 amplifies Iac at Ro2, thereby generating ΔVout.

When the state deviates from the steady state, and Iac increases, the emitter resistance Re of the NPN transistor 18 becomes sufficiently small compared with Ro2. Thus, as described on a third line of Expression 3, Ro2·Re/(Ro2+Re) is approximated to Re, and the second current supply unit 5 amplifies Iac at Re so that ΔVout does not saturate. Ro2>>Re is obtained, and thus an amplification factor on this occasion is much smaller than the amplification factor in the case of the steady state.

Thus, even when the AC current changes across a wide range, the circuit operation does not saturate, and the voltage change ΔVout can be detected based on the change in Iac. Moreover, Idc does not contribute to an operation of the second current supply unit 5, and ΔVout can thus be detected without influence of the DC current.

Due to the above-mentioned reason, in the current-to-voltage conversion circuit 100 according to this embodiment, with respect to the current signal including the DC component having a wide dynamic range and the AC component having a wide dynamic range, the removal of the DC component and the detection of the AC component can simultaneously be carried out.

(Second Embodiment)

Figure 5:
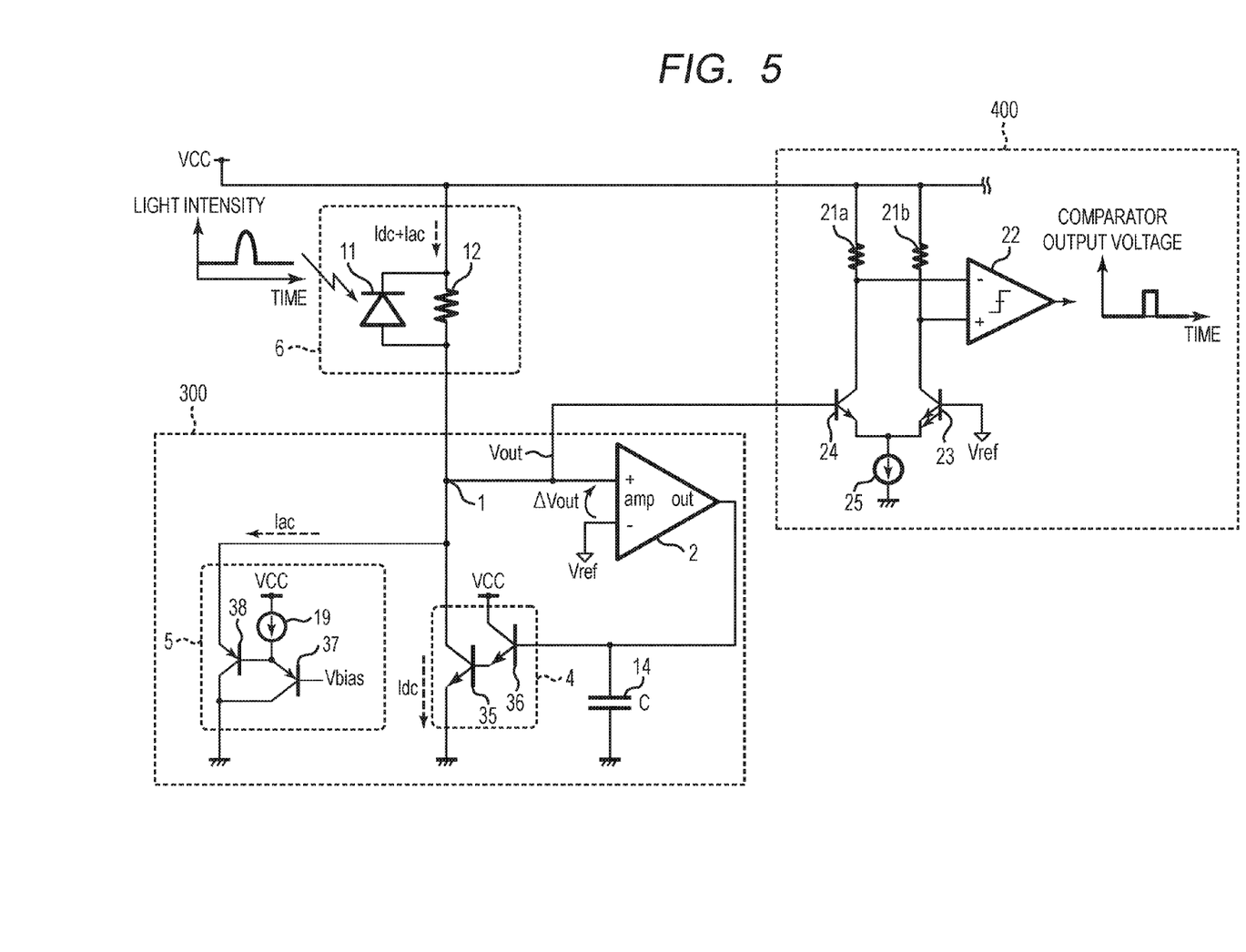
FIG. 5 is a circuit diagram for illustrating a current-to-voltage conversion circuit according to a second embodiment of the present invention.

FIG. 5 is a circuit diagram for illustrating a configuration of a current-to-voltage conversion circuit 300 and an output circuit 400 according to a second embodiment of the present invention.

According to this embodiment, the directions of the currents Idc and Iac of the current signal source 6 are opposite to those in the case of the first embodiment illustrated in FIG. 2. In other words, the current-to-voltage conversion circuit 300 according to this embodiment has a circuit configuration applicable to an optical sensor of a current source type. As a result, the polarity of each of transistors is different from that of FIG. 2. Specifically, the PNP transistors 15 and 16 of FIG. 2 are respectively replaced by NPN transistors 35 and 36 of FIG. 5. Moreover, the NPN transistors 17 and 18 of FIG. 2 are respectively replaced by PNP transistors 37 and 38 of FIG. 5. Further, polarities of the current signal source 6 and the current source 19 are opposite.

In addition, in FIG. 5, the voltage change ΔVout of the input/output node 1 caused by the current Iac, which is the alternating current component of the current signal, is a positive value, and is opposite in the polarity to the case of FIG. 2. As a result of the inversion of the polarity of ΔVout, the voltage input node of the output circuit 400 is opposite. In other words, the input/output node 1 is connected to the base of the NPN transistor 24, and, to the base of the multi-emitter NPN transistor 23, the reference voltage Vref is input. Other configurations and operations of the respective circuits are the same as those of the first embodiment, and a description thereof is therefore omitted.

According to this embodiment, the present invention can be applied to the current signal source 6 configured to output Idc and Iac in the directions opposite to those of the first embodiment.

(Third Embodiment)

Figure 6:
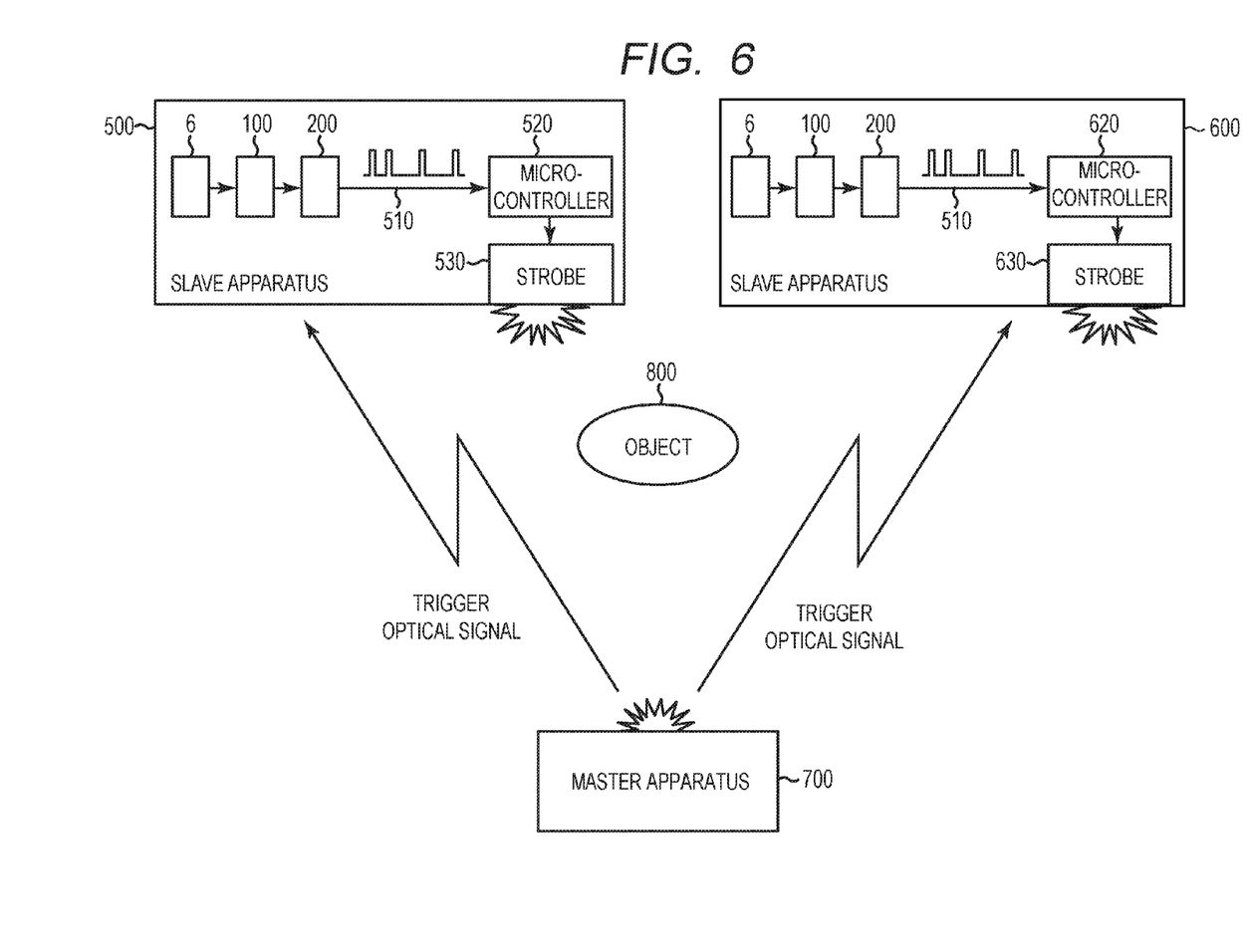
FIG. 6 is a block diagram for illustrating an imaging system according to a third embodiment of the present invention.

As a third embodiment of the present invention, a description is now given of an application example of the current-to-voltage conversion circuits 100 and 300 described as the first and second embodiments to an imaging system. In the following description, an application example of the current-to-voltage conversion circuit 100 of the first embodiment is exemplified, but the same applies to a case in which the current-to-voltage conversion circuit 300 according to the second embodiment is applied. FIG. 6 is a schematic diagram for illustrating the imaging system including a master apparatus 700 and slave apparatus 500 and 600 each having the current-to-voltage conversion circuit 100 installed thereon. The imaging system according to this embodiment is a strobe system in which the master apparatus 700 transmits a trigger optical signal, and the slave apparatus 500 and 600 are triggered by the trigger optical signal to generate flash light, thereby photographing an image of an object 800 by using a plurality of strobes. Note that, in this embodiment, the imaging system including the two slave apparatus 500 and 600 is exemplified, but the number of the slave apparatus may be one or three or more.

The master apparatus 700 has a function of controlling operation timings of the entire imaging system, and includes at least one of an imaging apparatus or a strobe. The master apparatus 700 transmits the trigger optical signal at a timing based on a user operation or the like to the slave apparatus 500 and 600. In other words, the master apparatus 700 is a transmission apparatus of the trigger optical signal, and the slave apparatus 500 and 600 are reception apparatus of the trigger optical signal. This trigger optical signal is a trigger signal for transmitting data having a predetermined bit length by means of pulse light whose light intensity changes in a pulse form. For this trigger optical signal, for example, visible light and infrared light can be used. A light emission apparatus configured to output the trigger optical signal may be provided as a dedicated apparatus in the master apparatus 700, or may be a strobe for the imaging included in the master apparatus 700.

The slave apparatus 500 includes the current signal source 6, the current-to-voltage conversion circuit 100, the output circuit 200, a microcontroller 520, and a strobe 530. As the current signal source 6, the current-to-voltage conversion circuit 100, and the output circuit 200, those described in the first and second embodiments are used. The current signal source 6 is a reception unit for the trigger optical signal, and is configured to output a current signal based on the trigger optical signal output from the master apparatus 700.

The current-to-voltage conversion circuit 100 outputs a voltage signal based on the alternating current component of the current signal output from the current signal source 6. The output circuit 200 is configured to shape the voltage signal output from the current-to-voltage conversion circuit 100 into a digital signal pulse, and output the digital signal pulse as bit data 510 to the microcontroller 520.

The microcontroller 520 analyzes the input bit data 510. When the bit data 510 matches a predetermined bit string, the microcontroller 520 controls the strobe 530 to generate flash light. Note that, the bit data 510 may include control data such as a drive method for the strobe 530 and a flash light amount.

The configuration of the slave apparatus 600 is the same as that of the slave apparatus 500, and a description thereof is therefore omitted.

Processing carried out by the microcontroller 520 of the slave apparatus 500 and processing carried out by the microcontroller 620 of the slave apparatus 600 may be the same or different from each other. The pieces of the processing of the respective microcontrollers 520 and 620 may be differentiated by changing contents of internal program codes of the microcontrollers 520 and 620. As a result, for the trigger optical signal from the master apparatus 700, the strobe 530 of the slave apparatus 500 and the strobe 630 of the slave apparatus 600 can be controlled so as to emit the light simultaneously or selectively. Moreover, when the master apparatus 700 includes a strobe, the strobe can also be controlled to emit the light simultaneously or selectively.

As a result of the sequence of control, a part or all of the plurality of strobes can be controlled to simultaneously emit the light, thereby irradiating the object 800 with the flashlight in a plurality of directions.

When visible light or infrared light is used as the trigger optical signal, light amount of an imaging environment may be disturbance. The disturbance light caused in this way is wide in the dynamic range, and may affect a detection accuracy of the trigger optical signal. However, the light caused by the imaging environment can be considered to be approximately constant during an imaging period. By using the current-to-voltage conversion circuit 100 according to the first embodiment, the DC component can be effectively removed, and influence of the light amount of the imaging environment can thus be reduced. Thus, the configuration of this embodiment can reliably carry out the control by means of the trigger optical signal.

(Other Embodiment)

According to the first and second embodiments, each of the first current supply unit 4 and the second current supply unit 5 is constructed by the two transistors of the Darlington pair. This configuration provides an effect of securing a desired dynamic range by increasing the amplification factor, but the configurations may be other than the Darlington pair, and, as long as the desired amplification factor can be secured, the number of the transistors may be one, or other circuit configurations may be used. For example, the inverted Darlington pair may be used. Moreover, in order to further increase the amplification factor, three or more transistors may be used.

In the first embodiment, a resistance element may be added between the emitter of the PNP transistor 15 and the power supply voltage VCC. When the current signal including the AC component is input, this current is mainly supplied from the NPN transistor 18, but a current also slightly flows through the PNP transistor 15. As a result, an inrush current may thus flow through the PNP transistor 15, but, by adding the resistance element between the emitter of the PNP transistor 15 and the power supply voltage VCC, the influence of the inrush current is alleviated. The same applies to the second embodiment.

In the first embodiment, the multi-emitter NPN transistor 23 is provided in the output circuit 200, but this transistor can be replaced by a usual NPN transistor when another unit is used to provide the difference between the threshold voltage Vth and the reference voltage Vref. For example, by setting the resistance of the resistance element 21a to be larger than the resistance of the resistance element 21b, the same operation can be provided. Moreover, the voltage value of the reference voltage input to the base of the NPN transistor 24 may be set to be smaller than Vref. The same applies to the second embodiment.

In the first and second embodiments, the OTA is used in the amplification unit 2 due to the advantage of the high output impedance, but the amplification unit is not limited to the OTA. The amplification unit only needs to have the amplification function capable of constructing the feedback loop so that the voltage of the input/output node 1 maintains the predetermined value, and an amplification circuit other than the OTA may be employed.

In the first and second embodiments, the low-pass filter constructed by the output impedance of the amplification unit 2 and the capacitance element 14 is used in the extraction unit 3, but the extraction unit 3 is not limited to this configuration. The extraction unit 3 only needs to have the function of extracting the DC component, and, for example, a resistance element may be provided in place of the use of the output impedance of the OTA. Alternatively, the low-pass filter may be replaced by a low-pass filter having a different circuit configuration using an inductor.

The imaging system described as the third embodiment is an example of the imaging system to which the current-to-voltage conversion circuit according to the present invention can be applied, but the apparatus to which the current-to-voltage conversion circuit according to the present invention can be applied is not limited to this imaging system. For example, by replacing the strobes 530 and 630 of the slave apparatus 500 and 600 by imaging apparatus, the imaging system may be modified to a remote camera system configured to control remote cameras or a multi-camera system configured to control a plurality of cameras. As described above, the processing carried out in the master apparatus 700 and the slave apparatus 500 and 600 only needs to require transmission/reception of signals between the plurality of apparatus, and can be used in an arbitrary application.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-084930, filed Apr. 17, 2015, which is hereby incorporated by reference herein in its entirety.

What is claimed is:

1. A current-to-voltage conversion circuit comprising:
an input/output node configured to input a current signal including a direct current component and an alternating current component, and to output a voltage based on the current signal;
an amplification unit configured to input the voltage of the input/output node;
an extraction unit configured to output a voltage based on a direct current component of a voltage output from the amplification unit;
a first current supply unit configured to supply a current based on the voltage output from the extraction unit to the input/output node; and
a second current supply unit configured to supply a current based on the alternating current component of the current signal to the input/output node,
wherein:
the current supplied by the second current supply unit corresponds to a difference between a current of the current signal and the current supplied by the first current supply unit;
the second current supply unit comprises a bipolar transistor;
the bipolar transistor has an emitter connected to the input/output node; and
the bipolar transistor has a base to which, when the voltage of the input/output node is a voltage based on the direct current component of the current signal, a bias voltage is input so that the bipolar transistor is cut off.

2. The current-to-voltage conversion circuit according to claim 1, wherein the second current supply unit comprises a plurality of the bipolar transistors connected as one of a Darlington pair and an inverted Darlington pair.

3. The current-to-voltage conversion circuit according to claim 1, wherein:
the amplification unit comprises an operational transconductance amplifier (OTA); and
the extraction unit comprises a low-pass filter formed by an output impedance of the OTA and a capacitance element connected between a power supply voltage and an output terminal of the OTA.

4. A current-to-voltage conversion circuit comprising:
an input/output node configured to input a current signal including a direct current component and an alternating current component, and to output a voltage based on the current signal;
an amplification unit configured to input the voltage of the input/output node;
an extraction unit configured to output a voltage based on a direct current component of a voltage output from the amplification unit;
a first current supply unit configured to supply a current based on the voltage output from the extraction unit to the input/output node; and
a second current supply unit configured to supply a current based on the alternating current component of the current signal to the input/output node,
wherein
the current supplied by the second current supply unit corresponds to a difference between a current of the current signal and the current supplied by the first current supply unit;
the first current supply unit comprises a bipolar transistor;
the bipolar transistor has a collector connected to the input/output node; and
the bipolar transistor has a base to which the voltage output from the extraction unit is input.

5. The current-to-voltage conversion circuit according to claim 4, wherein the first current supply unit comprises a plurality of the bipolar transistors connected as one of a Darlington pair and an inverted Darlington pair.

6. The current-to-voltage conversion circuit according to claim 1, further comprising a comparison circuit configured to output a signal obtained by comparing the voltage of the input/output node and a predetermined threshold voltage,
wherein the threshold voltage is set to a voltage between the voltage of the input/output node when only the direct current component of the current signal is input and the voltage of the input/output node when the alternating current component of the current signal is further input.

7. A reception apparatus, comprising:
a reception unit comprising a sensor of a current output type; and
a current-to-voltage conversion circuit configured to output a voltage based on an alternating current component of a current signal output from the reception unit, the current-to-voltage conversion circuit comprising:
an input/output node configured to input the current signal including a direct current component and the alternating current component, and to output the voltage based on the current signal;
an amplification unit configured to input the voltage of the input/output node;
an extraction unit configured to output a voltage based on a direct current component of a voltage output from the amplification unit;
a first current supply unit configured to supply a current based on the voltage output from the extraction unit to the input/output node; and
a second current supply unit configured to supply a current based on the alternating current component of the current signal to the input/output node,
wherein:
the current supplied by the second current supply unit corresponds to a difference between a current of the current signal and the current supplied by the first current supply unit;
the second current supply unit comprises a bipolar transistor;
the bipolar transistor has an emitter connected to the input/output node; and
the bipolar transistor has a base to which, when the voltage of the input/output node is a voltage based on the direct current component of the current signal, a bias voltage is input so that the bipolar transistor is cut off.

8. An imaging system, comprising:
a transmission apparatus configured to transmit a trigger signal; and
a reception apparatus comprising:
a reception unit comprising a sensor of a current output type, and being configured to receive the trigger signal in the sensor, to thereby output a current signal; and
a current-to-voltage conversion circuit configured to output a voltage signal based on an alternating current component of the current signal output from the reception unit, the current-to-voltage conversion circuit comprising:

an input/output node configured to input the current signal including a direct current component and the alternating current component, and to output a voltage based on the current signal;

an amplification unit configured to input the voltage of the input/output node;

an extraction unit configured to output a voltage based on a direct current component of a voltage output from the amplification unit;

a first current supply unit configured to supply a current based on the voltage output from the extraction unit to the input/output node; and a second current supply unit configured to supply a current based on the alternating current component of the current signal to the input/output node, wherein:

the current supplied by the second current supply unit corresponds to a difference between a current of the current signal and the current supplied by the first current supply unit;

the second current supply unit comprises a bipolar transistor;

the bipolar transistor has an emitter connected to the input/output node; and the bipolar transistor has a base to which, when the voltage of the input/output node is a voltage based on the direct current component of the current signal, a bias voltage is input so that the bipolar transistor is cut off.

* * * * *